(12) United States Patent
Kim et al.

(10) Patent No.: US 8,664,751 B2
(45) Date of Patent: Mar. 4, 2014

(54) SEMICONDUCTOR PACKAGE

(75) Inventors: Yong-hoon Kim, Suwon-si (KR); Hee-Seok Lee, Yongin-si (KR); Jin-ha Jeong, Suwon-si (KR)

(73) Assignee: Samsung Electronics Co., Ltd. (KR)

( * ) Notice: Subject to any disclaimer, the term of this patent is extended or adjusted under 35 U.S.C. 154(b) by 92 days.

(21) Appl. No.: 13/115,431

(22) Filed: May 25, 2011

(65) Prior Publication Data
US 2011/0304015 A1 Dec. 15, 2011

(30) Foreign Application Priority Data

Jun. 10, 2010 (KR) .......................... 10-2010-0055109

(51) Int. Cl.
*H01L 23/552* (2006.01)
(52) U.S. Cl.
USPC .......................................... 257/660; 257/659
(58) Field of Classification Search
USPC .......................................... 257/532, 660, 659
See application file for complete search history.

(56) References Cited

U.S. PATENT DOCUMENTS

| 5,561,265 A | 10/1996 | Livshits et al. |
| 7,109,410 B2 * | 9/2006 | Arnold et al. ................. 174/390 |
| 8,105,872 B2 * | 1/2012 | Pagaila et al. ................. 438/106 |
| 2010/0140759 A1 * | 6/2010 | Pagaila et al. ................. 257/660 |

FOREIGN PATENT DOCUMENTS

| JP | 2003-297983 | 10/2003 |
| JP | 2003-309196 | 10/2003 |

* cited by examiner

*Primary Examiner* — Douglas Menz
(74) *Attorney, Agent, or Firm* — Onello & Mello, LLP

(57) ABSTRACT

A semiconductor package includes a substrate in which a plurality of wires are formed; at least one semiconductor chip electrically connected to portions of the plurality of wires; and a shielding can mounted on the substrate, surrounding the at least one semiconductor chip, electrically connected to at least one wire of the plurality of wires and including a soft magnetic material. The semiconductor package can prevent or substantially reduce electromagnetic interference (EMI).

8 Claims, 6 Drawing Sheets

US 8,664,751 B2

SEMICONDUCTOR PACKAGE

CROSS-REFERENCE TO RELATED APPLICATIONS

This application claims the benefit under 35 U.S.C. 119 of Korean Patent Application No. 10-2010-0055109, filed in the Korean Intellectual Property Office on Jun. 10, 2010, the entire contents of which are incorporated herein by reference.

BACKGROUND

The inventive concept relates to a semiconductor package, and more particularly, to a semiconductor package including an electromagnetic wave shielding unit.

Electromagnetic interference (EMI) occurs in response to an electromagnetic signal. Specifically, EMI occurs in response to an electromagnetic signal that is undesirably radiated emitted (RE) or conducted emitted (CE) from an electronic device. EMI can disturb operation of other adjacent elements, lower the performance of circuits, and cause malfunction.

SUMMARY

According to one aspect, the inventive concept is directed to a semiconductor package. The semiconductor package includes a substrate on which a plurality of conductive elements is formed and at least one semiconductor chip electrically connected to at least one of the plurality of conductive elements. A shielding can is mounted on the substrate. The shielding can surrounds the at least one semiconductor chip. The shielding can is electrically connected to at least one conductive element of the plurality of conductive elements. The shielding can comprises a soft magnetic material.

In some embodiments, the soft magnetic material comprises an iron oxide and at least one metal, the metal being selected from the group consisting of nickel (Ni), zinc (Zn), manganese (Mn), cobalt (Co), magnesium (Mg), aluminum (Al), barium (Ba), copper (Cu), and iron (Fe).

In some embodiments, the shielding can comprises a metal layer, a soft magnetic material layer comprising the soft magnetic material, and an insulating adhesive layer.

In some embodiments, the plurality of conductive elements comprises ground wires. In some embodiments, the semiconductor package further comprises at least one through via (TV) extending in a direction perpendicular to the substrate and electrically connecting the shielding can and the ground wires.

In some embodiments, the shielding can is mounted such that it surrounds an upper portion and side portions of the substrate.

In some embodiments, the semiconductor package further comprises a heat slug formed on the shielding can.

In some embodiments, the at least one semiconductor chip comprises a plurality of semiconductor chips, the plurality of semiconductor chips having a vertical stack structure.

In some embodiments, a thickness of the shielding can is smaller than 300 μm.

According to another aspect, the inventive concept is directed to a semiconductor package, which includes a first substrate and a second substrate stacked on the first substrate. At least one lower semiconductor chip is formed on the first substrate, and at least one upper semiconductor chip is formed on the second substrate. A first encapsulation material covers the upper semiconductor chip. A shielding can is mounted on the first substrate, surrounding the upper and lower semiconductor chips, and comprising a soft magnetic material. A ground connection element electrically connects the shielding can to a ground voltage.

In some embodiments, the shielding can further comprises a metal layer.

In some embodiments, the ground connection element electrically connects the shielding can and a ground wire formed in at least one of the first and second substrates.

In some embodiments, the ground connection element electrically connects the shielding can and a ground terminal formed in at least one of the upper and lower semiconductor chips.

In some embodiments, the semiconductor package further comprises a substrate connection element electrically connecting the first substrate and the second substrate.

In some embodiments, the semiconductor package further comprises a second encapsulation material covering the lower semiconductor chip, wherein the substrate connection element comprises through vias (TVs) formed through the second encapsulation material.

According to another aspect, the inventive concept is directed to a semiconductor package, which includes a substrate and a plurality of conductive elements formed on the substrate. A semiconductor chip is electrically connected to at least one of the plurality of conductive elements. A shielding can is mounted on the substrate, the shielding can surrounding the semiconductor chip and being electrically connected to at least one conductive element of the plurality of conductive elements, the shielding can comprising a metal, a soft magnetic material layer, and an insulating adhesive layer. The soft magnetic material layer comprises a soft magnetic material, the soft magnetic material comprising an iron oxide and at least one metal, the metal being selected from the group consisting of nickel (Ni), zinc (Zn), manganese (Mn), cobalt (Co), magnesium (Mg), aluminum (Al), barium (Ba), copper (Cu), and iron (Fe).

In some embodiments, the semiconductor package further comprises a heat slug for removing heat from the semiconductor package.

In some embodiments, the shielding can further comprises a metal layer.

In some embodiments, the semiconductor package further comprises an encapsulation material covering the semiconductor chip.

In some embodiments, the shielding can surrounds an upper portion and side portions of the substrate.

According to another aspect of the inventive concept, there is provided a semiconductor package including: a mother board in which a first ground wire and a power supply wire are formed; a voltage generation module mounted on the mother board for supplying a ground voltage and a power supply voltage to the first ground wire and the power supply wire, respectively; and an integrated circuit (IC) package surrounded by a shielding can including a soft magnetic material.

The IC package may include: an external connection electrode electrically connected to the mother board; a first substrate electrically connected to the external connection electrode; at least one semiconductor chip formed on the first substrate; an encapsulation material covering the at least one semiconductor chip; and the shielding can mounted on the first substrate, surrounding the at least one semiconductor chip, and including a metal layer.

The first substrate may include a second ground wire, and the second ground wire may be electrically connected to the shielding can. For example, the second ground wire may be opened onto the first substrate. However, when the second ground wire is buried on the first substrate, the second ground wire may be opened by forming an additional window on the first substrate.

The first substrate may include a second ground wire, and the second ground wire and the shielding can may be electrically connected to each other via through vias (TVs) extending in a direction perpendicular to the first substrate.

The semiconductor package may further include a decoupling capacitor formed on the mother board for removing signal interference that occurs in the IC package. The decoupling capacitor is merely an example; that is, a passive element for removing interference that occurs among a plurality of signals may be formed on the mother board.

BRIEF DESCRIPTION OF THE DRAWINGS

The foregoing and other features and advantages of the inventive concept will be apparent from the more particular description of preferred embodiments of the inventive concept, as illustrated in the accompanying drawings in which like reference characters refer to the same parts throughout the different views. The drawings are not necessarily to scale, emphasis instead being placed upon illustrating the principles of the inventive concept. In the drawings, the thickness of layers and regions are exaggerated for clarity.

DETAILED DESCRIPTION OF THE EMBODIMENTS

Figure 1:
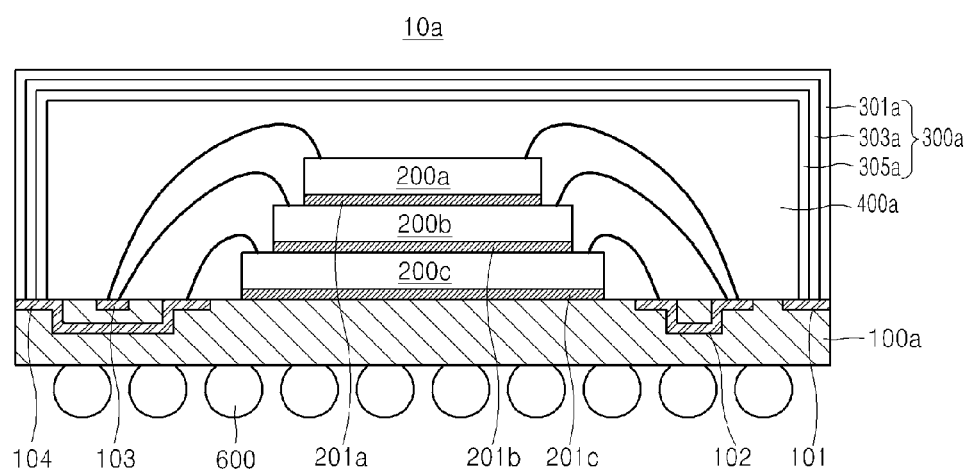
FIGS. 1 through 7 are schematic cross-sectional views of a semiconductor package according to embodiments of the inventive concept.

Reference will now be made in detail to exemplary embodiments, examples of which are illustrated in the accompanying drawings. Like reference numerals refer to like elements, and descriptions for the like elements will not be repeated.

Exemplary embodiments are not limited to the embodiments illustrated hereinafter, and the embodiments herein are rather described to provide complete understanding of the scope and spirit of inventive concept. In the drawings, the thicknesses of layers and regions are exaggerated for clarity.

The exemplary embodiments will now be described more fully with reference to the accompanying drawings. The inventive concept may, however, be embodied in many different forms and should not be construed as being limited to the exemplary embodiments set forth herein.

The terminology used herein is for the purpose of describing particular embodiments only and is not intended to be limiting of the inventive concept. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

It will be understood that when an element, such as a layer, a region, or a substrate, is referred to as being "on," "connected to" or "coupled to" another element, it may be directly on, connected or coupled to the other element or intervening elements may be present. In contrast, when an element is referred to as being "directly on," "directly connected to" or "directly coupled to" another element or layer, there are no intervening elements or layers present.

The terminology used herein is for the purpose of describing particular embodiments only and is not intended to be limiting of exemplary embodiments. As used herein, the singular forms "a," "an" and "the" are intended to include the plural forms as well, unless the context clearly indicates otherwise. It will be further understood that the terms "comprises" and/or "comprising" when used in this specification, specify the presence of stated features, integers, steps, operations, elements, and/or components, but do not preclude the presence or addition of one or more other features, integers, steps, operations, elements, components, and/or groups thereof.

Exemplary embodiments are described herein with reference to cross-sectional illustrations that are schematic illustrations of exemplary embodiments (and intermediate structures). As such, variations from the shapes of the illustrations as a result, for example, of manufacturing techniques and/or tolerances, are to be expected. Thus, exemplary embodiments should not be construed as limited to the particular shapes of regions illustrated herein but may be to include deviations in shapes that result, for example, from manufacturing.

Unless otherwise defined, all terms (including technical and scientific terms) used herein have the same meaning as commonly understood by one of ordinary skill in the art to which exemplary embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

FIG. 1 is a schematic cross-sectional view of a semiconductor package 10a according to an exemplary embodiment of the inventive concept. Referring to FIG. 1, the semiconductor package 10a may include a substrate 100a, a plurality of wires, semiconductor chips 200a, 200b, and 200c, and a shielding can 300a.

In some exemplary embodiments, the substrate 100a may be a printed circuit board (PCB) on or in which a plurality of conductors, such as wires or printed conductive elements or traces 101, 102, 103, and 104 are formed. In some exemplary embodiments, the substrate 100a may be a semiconductor substrate and may include a silicon substrate, a silicon-germanium (Si—Ge) substrate, a silicon-on-insulation (SOI) substrate, or other substrate.

In some embodiments, the plurality of conductive elements 101, 102, 103, and 104 formed on or in the substrate 100a may include a conductive material, for example, doped polysilicon or indium tin oxide (ITO). Also, in some embodiments, the plurality of conductive elements 101, 102, 103, and 104 may include at least one metal selected from the group consisting of aluminum (Al), gold (Au), beryllium (Be), bismuth (Bi), cobalt (Co), copper (Cu), hafnium (Hf), indium (In), manganese (Mn), molybdenum (Mo), nickel (Ni), lead (Pb), palladium (Pd), platinum (Pt), rhodium (Rh), rhenium (Re), ruthenium (Ru), tantalum (Ta), tellurium (Te), titanium (Ti), tungsten (W), zinc (Zn), and zirconium (Zr).

A ground voltage GND and a power supply voltage VDD may be selectively applied to the plurality of conductive elements 101, 102, 103, and 104. A conductive element to which the ground voltage GND is applied may be referred to as a ground wire, and a conductive element to which the power supply voltage VDD is applied may be referred to as a power supply wire.

In some exemplary embodiments, the semiconductor chips 200a, 200b, and 200c are electrically connected to the conductive elements 101, 102, 103, and 104 formed in the substrate 100a. The plurality of semiconductor chips 200a, 200b, and 200c may be vertically stacked on the substrate 100a. In some exemplary embodiments, the semiconductor chips 200a, 200b, and 200c and the conductive elements 101, 102, 103, and 104 formed in the substrate 100a may be connected to one another via conductive pads and conductive wires. In addition, the semiconductor chips 200a, 200b, and 200c may be connected to the conductive elements 101, 102, 103, and 104 using conductive bumps and/or solder balls disposed on the conductive pads. In the drawing, the semiconductor chips 200a, 200b, and 200c are connected to the conductive elements 101, 102, 103, and 104 formed in the substrate 100a via conductive wires. However, the inventive concept is not limited to this configuration, but is applicable to other connection approaches, such as the conductive bumps, solder balls, etc.

In general, in some embodiments of the inventive concept, when the plurality of semiconductor chips 200a, 200b, and 200c are vertically stacked on the substrate 100a, the plurality of semiconductor chips 200a, 200b, and 200c may have different sizes. Also, the plurality of semiconductor chips 200a, 200b, and 200c may be electrically connected to one another via a bonding wire, a through via (TV), or the like. In addition, the plurality of semiconductor chips 200a, 200b, and 200c may be integrated circuits (ICs) that perform different operations.

Also, according to embodiments of the inventive concept, each of the semiconductor chips 200a, 200b, and 200c may be a semiconductor memory device, for example, a dynamic random accessory memory (DRAM), a static RAM (SRAM), a flash memory device, a magnetic RAM (MRAM), a ferroelectric RAM (FeRAM), a phase change RAM (PRAM), or other memory device.

According to the embodiments of the inventive concept, the shielding can 300a may remove electromagnetic interference (EMI) generated in the semiconductor chips 200a, 200b, and 200c by including a soft magnetic material. As noted above, EMI includes conducted emission (CE) and radiated emission (RE). Conducted emission (CE) is electromagnetic noise generated at a frequency less than 30 MHz, transmitted via a medium, such as a signal line or a power supply line, and measured in a region of the shielding can 300a. Radiated emission (RE) is electromagnetic noise generated at a frequency greater than 30 MHz, and radiated in the air, and thus has a wider radiation range than that of electromagnetic noise due to CE.

In some exemplary embodiments, the soft magnetic material may be a soft magnetic metal powder or a soft magnetic alloy powder. The material may include a ferrite material. Thus, the soft magnetic material may be continuously or discontinuously disposed in the shielding can 300a.

In some exemplary embodiments, the ferrite material includes at least one metal and an iron oxide, such as FeO, $Fe_2O_3$, $Fe_2O_4$, $Fe_3O_4$, or the like. A metal that may be combined with an iron oxide may be, for example, nickel (Ni), zinc (Zn), manganese (Mn), cobalt (Co), magnesium (Mg), aluminum (Al), barium (Ba), copper (Cu), iron (Fe), or the like. The ferrite material may have a high specific resistance and low saturation magnetization. In addition, in some exemplary embodiments, a metal may be combined with the ferrite material to provide mechanical strength.

The shielding can 300a may include a metal layer 301a, a soft magnetic material layer 303a, and an adhesive layer 305a. In some embodiments, the soft magnetic material layer 303a may include a ferromagnetic material. The metal layer 301a supplements the low mechanical strength of the soft magnetic material layer 303a. As a result, the shielding can 300a is able to have a uniform shape and is able to be adhered to a first region 400a of the package 10a via the adhesive layer 305a. In some particular exemplary embodiments, the adhesive layer 305a may be a binder having high conductivity.

In addition, according to exemplary embodiments, a cushioning or buffering material is interposed between an internal surface of the shielding can 300a and the semiconductor chips 200a, 200b, and 200c. In particular exemplary embodiments, the cushioning or buffering material may be, for example, a cushioning foam, such as PORON® cushioning foam, manufactured and sold by Rogers Corporation, having its corporate headquarters in Rogers, Conn., USA. The buffering or cushioning material may protect the semiconductor chips 200a, 200b, and 200c from an external shock. When the shielding can 300a is applied to a portable terminal, the shielding can 300a functions as a protection cap for protecting functionality of a device from being degraded by outside noise.

In some embodiments, the shielding can 300a may be mounted as a surface mounted device (SMD). In FIG. 1, the shielding can 300a is shown to be mounted such that the shielding can 300a is able to be electrically connected to the conductive elements 101 and 104 formed in the substrate 100a. In some particular exemplary embodiments, each of the conductive elements 101 and 104 may be exposed on the substrate 100a and may be electrically connected to the shielding can 300a. For example, the conductive elements 101 and 104 may be ground wires electrically connected to the ground voltage GND. When the shielding can 300a is connected to the ground wires, a degree to which the shielding can 300a removes EMI may be greater when compared to a configuration in which the shielding can 300a is not connected to the ground wires. In some specific experimental examples carried out by the inventors, the degree to which the shielding can 300a connected to the ground wires removes EMI was improved by about 5 dB.

The adhesive layer 305a prevents the shielding can 300a and the internal semiconductor chips 200a, 200b, and 200c from being electrically connected. The adhesive layer 305a also prevents the shielding can 300a from being electrically connected to the region 400a. In some particular exemplary embodiments, the adhesive layer 305a may include at least one of a silicon oxide ($Si_xO_y$), an aluminum oxide ($Al_xO_y$), a hafnium oxide ($Hf_xO_y$), a zirconium oxide ($Zr_xO_y$), an yttrium oxide ($Y_xO_y$), a lanthanum oxide ($La_xO_y$), a tantalum oxide ($Ta_xO_y$), a praseodymium oxide ($Pr_xO_y$), a titanium oxide ($Ti_3O_y$), an aluminum silicon oxide ($Al_xSi_yO_z$), a zirconium silicon oxide ($ZrSi_xO_y$), and a hafnium silicon oxide ($HfSi_xO_y$).

The shielding can 300a of the semiconductor package 10a according to the embodiments of the inventive concept may entirely surround an upper portion and side portions of the semiconductor package 10a. Thus, the shielding can 300a of the semiconductor package 10a according to the embodiments of the inventive concept may absorb EMI radiated in several directions.

The first region 400a defined by the shielding can 300a may include a cavity and an encapsulation material having an insulation property. When the first region 400a is sealed with the encapsulation material, the conductive wires through which the semiconductor chips 200a, 200b, and 200c are electrically connected to the substrate 100a are protected.

The semiconductor package 10a may further include conductive external connection electrodes 600 electrically connected to the substrate 100a. The semiconductor package 10a may be mounted on other substrates via the conductive external connection electrodes 600. In some exemplary embodiments, the conductive external connection electrodes 600 are formed on one surface of the substrate 100a. This permits mounting or stacking of the semiconductor package 10a on a mother board or on other semiconductor packages. A plurality of conductive elements may be exposed on the one surface of the substrate 100a on which the conductive external connection electrodes 600 are formed. These conductive elements may be electrically connected to the conductive external connection electrodes 600. In some exemplary embodiments, the conductive external connection electrodes 600 may be conductive bumps, such as solder balls, solder bumps, solder paste, or the like. They may be arranged in a grid or matrix configuration, which permits implementing a ball grid array (BGA) package. In some exemplary embodiments, high-temperature heat treatment, such as, for example, a wave soldering or reflow soldering process, may be performed to bond the semiconductor package 10a to a mother board or other semiconductor packages via the conductive external connection electrodes 600.

Figure 2:
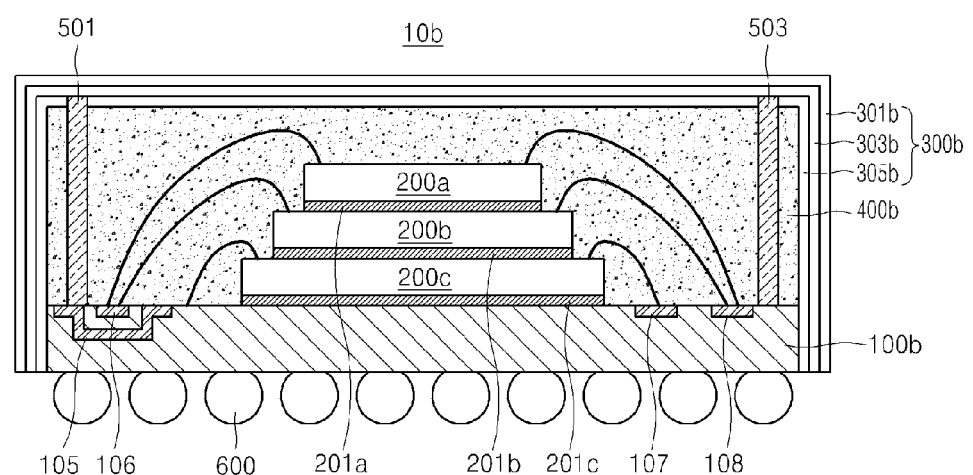

FIG. 2 is a schematic cross-sectional view of a semiconductor package 10b according to another exemplary embodiment of the inventive concept. Referring to FIG. 2, the semiconductor package 10b may include a substrate 100b, semiconductor chips 200a, 200b, and 200c, a shielding can 300b, and TVs 501 and 503. The same reference numerals as those of FIG. 1 refer to the same elements in FIG. 2, described above in detail in connection with FIG. 1. Therefore, detailed description of those elements will not be repeated here.

The shielding can 300b may surround an upper portion and side portions of the substrate 100b. The substrate 100b and the shielding can 300b are adhered to each other via an adhesive layer 305b. In some exemplary embodiments, the adhesive layer 305b may be an insulating layer. In this configuration, the substrate 100b and the shielding can 300b may not be electrically connected to each other, since the adhesive layer 305b is disposed between the shielding can 300b and the substrate 100b. The shielding can 300b may include a metal layer 301b and may be mounted to surround an upper portion and side portions of the semiconductor package 10b while maintaining its shape. The shielding can 300b may be mounted on the upper and side portions of the semiconductor package 10b after the semiconductor package 10b is manufactured to have a desired shape.

The semiconductor package 10b may include through vias (TVs) 501 and 503. The TVs 501 and 503 are formed on the substrate 100b, through a second region 400b defined by the shielding can 300b, and extending in a direction perpendicular to the substrate 100b. The second region 400b may include an encapsulation material that covers the semiconductor chips 200a, 200b, and 200c on the substrate 100b. The TVs 501 and 503 may be formed through the second region 400b and may electrically connect a soft magnetic material layer 303b of the shielding can 300b and a plurality of conductive elements formed in the substrate 100b to each other. For example, the TVs 501 and 503 may include through mold vias (TMVs). Each of the TVs 501 and 503 may be formed by applying a conductive material, for example, tin (Sb), lead (Pb), gold (Au), silver (Ag), copper (Cu), bismuth (Bi), or an alloy thereof, to a via hole formed through the encapsulation material included in the second region 400b.

Figure 3:
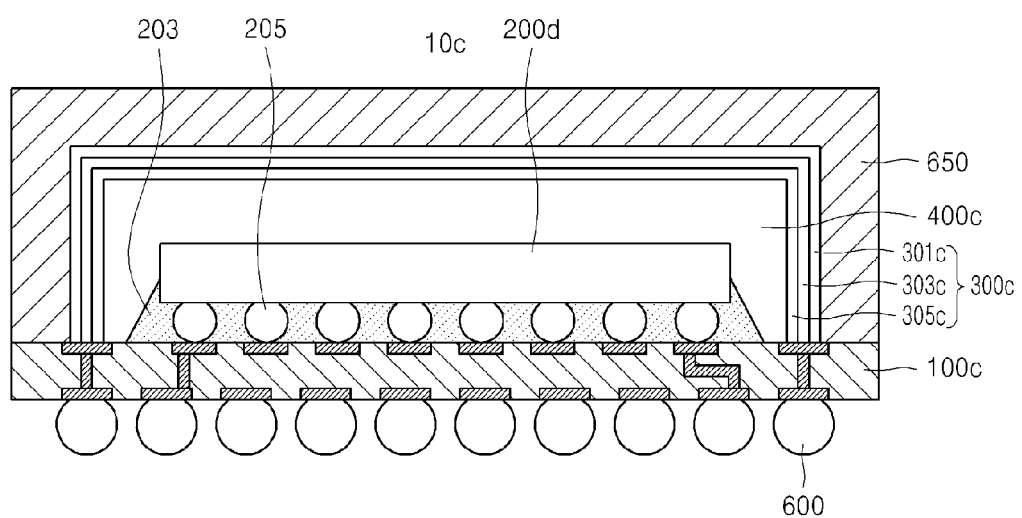

FIG. 3 is a schematic cross-sectional view of a semiconductor package 10c according to another exemplary embodiment of the inventive concept. Referring to FIG. 3, the semiconductor package 10c may include a substrate 100c, a semiconductor chip 200d, a shielding can 300c, and a heat slug 650. According to exemplary embodiments of the inventive concept, the semiconductor chip 200d formed on the substrate 100c may be mounted in a flip chip or wire bonding configuration. The semiconductor chip 200d may be electrically connected to the substrate 100c via conductive electrodes 205. In FIG. 3, the semiconductor chip 200d is illustrated as being mounted to the substrate 100c in the flip chip configuration via conductive electrodes 205. However, the inventive concept is not limited to the illustrated configuration.

In some exemplary embodiments, connection pads formed on the semiconductor chip 200d are disposed to face the substrate 100c. The connection pads of the semiconductor chip 200d may be electrically connected to a plurality of conductive elements formed in the substrate 100c by using the conductive electrodes 205, which may be, for example, solder balls. In the illustrated flip chip configuration, an electrical connection path is relatively short, and thus excellent thermal and electrical characteristics are obtained, and the size of the semiconductor package 10c is reduced.

An encapsulation material 203 is disposed between the semiconductor chip 200d and a top surface of the substrate 100c to protect an electrical connection between the semiconductor chip 200d and the conductive electrodes 205. In exemplary embodiments, the encapsulation material 203 may be formed by an underfill process using a capillary phenomenon. Alternatively, a liquid film formed of a resin-based material may be inserted between the semiconductor chip 200d and the top surface of the substrate 100c, and a thermo-compression process or a reflow process may be subsequently performed on the semiconductor chip 200d and the substrate 200c. While the thermo-compression process or the reflow process is performed, the liquid film may be cured, and a thermal or mechanical stress applied to the semiconductor chip 200d and the conductive electrodes 205 may be alleviated. In some exemplary embodiments, a region between the top surface of the substrate 100c and the semiconductor chip 200d may be completely filled by using a thermosetting resin material, such as an epoxy mold compound (EMC) or the like.

In addition, in some exemplary embodiments, when the encapsulation material 203 is filled between the semiconductor chip 200d and the substrate 100c, a third region 400c defined by the shielding can 300c on the semiconductor chip 200d may be buried by the encapsulation material 203 while the underfill process is performed. Thus, in this exemplary embodiment, the encapsulation material filled 203 between the semiconductor chip 200d and the substrate 100c may also cover an upper portion of the semiconductor chip 200d. According to the embodiments of the inventive concept, a process of underfilling a space between the semiconductor chip 200d and the substrate 100c of the semiconductor package 10c and a space above the upper portion of the semiconductor chip 200d is referred to as a molded underfill (MUF) process.

In FIG. 3, one semiconductor chip 200d is illustrated to be mounted on the substrate 100c. However, the inventive concept is not limited to that configuration. That is, according to the inventive concept, a plurality of semiconductor chips may be vertically stacked on the substrate 100c.

The third region 400c defined by the shielding can 300c on the substrate 100c may be a cavity or may be sealed by the encapsulation material 203. The shielding can 300c may be electrically connected to at least one of the plurality of conductive elements formed in the substrate 100c. Alternatively, the shielding can 300c may be adhered to the substrate 100c by an adhesive layer 305c to surround an upper portion of the substrate 100c and may be electrically connected to at least one of the plurality of conductive elements formed in the substrate 100c via TVs formed through the third region 400c, in a configuration similar to that illustrated in FIG. 2.

The semiconductor package 10c according to the exemplary embodiment illustrated in FIG. 3 may further include the heat slug 650 on the shielding can 300c. In some exemplary embodiments, the heat slug 650 is formed on the shielding can 300c and emits heat generated in the semiconductor package 10c. The heat slug 650 may be directly connected to the shielding can 300c or may be separated from the shielding can 300c by a predetermined distance. Since the heat slug 650 emits heat generated in the semiconductor chip 200d, the semiconductor package 10c according to the current embodiment may remove EMI generated in the semiconductor chip 200d and simultaneously may emit heat. As a result, the operating reliability of the semiconductor package 10c may be improved.

Figure 4:
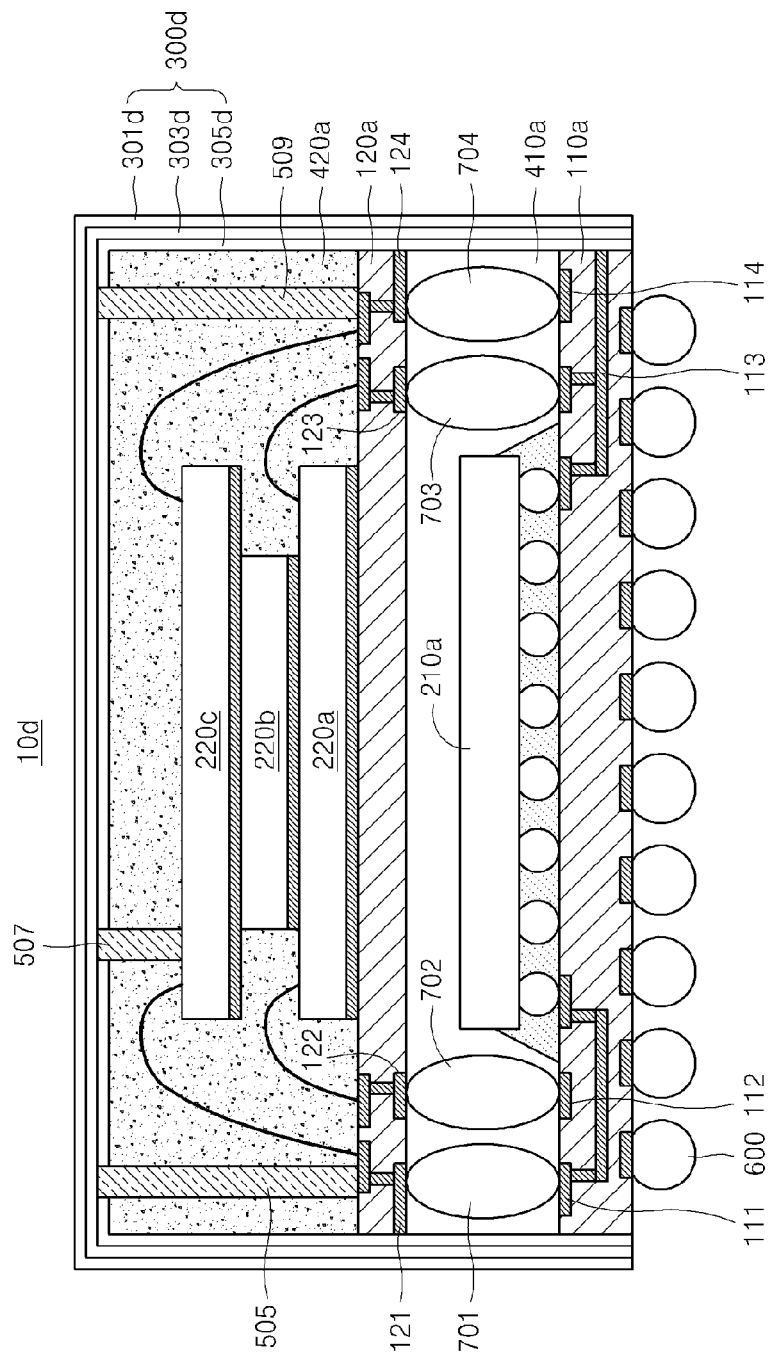

FIG. 4 is a schematic cross-sectional view of a semiconductor package 10d according to another exemplary embodiment of the inventive concept. Referring to FIG. 4, the semiconductor package 10d may include a first substrate 110a, a second substrate 120a, upper semiconductor chips 220a, 220b, and 220c, at least one lower semiconductor chip 210a, a shielding can 300d, and ground connection portions 505, 507, and 509. According to this exemplary embodiment, an encapsulation material seals a first upper region 420a defined by the shielding can 300d on the second substrate 120a. The encapsulation material may include an epoxy mold compound (EMC).

The first and second substrates 110a and 120a may include a plurality of conductive elements 111, 112, 113, 114, 121, 122, 123, and 124 formed on or in the substrates 110a and 120a. Each of the first substrate 110a and the second substrate 120a may constitute a semiconductor package. The semiconductor package 10d according to the exemplary embodiment of FIG. 4 may have a package on package (POP) or package in package (PIP) structure. According to the inventive concept, each of the first substrate 110a and the second substrate 120a may be a printed circuit board (PCB) and may each be a silicon substrate, a Si—Ge substrate, or an SOI substrate, for example. According to the embodiment of FIG. 4, the first substrate 110a and the second substrate 120a may be stacked in parallel to each other. In addition, the first substrate 110a and the second substrate 120a may be of different sizes. The shielding can 300d may have different shapes according to the sizes of the first substrate 110a and the second substrate 120a.

The upper semiconductor chips 220a, 220b, and 220c may be mounted on the second substrate 120a, and the lower semiconductor chip 210a may be mounted on the first substrate 110a. The upper semiconductor chips 220a, 220b, and 220c and the lower semiconductor chip 210a may be electrically connected to the second substrate 120a and the first substrate 110a, respectively, in a flip chip configuration or a wire bonding configuration or other configuration.

In some exemplary embodiments, each of the upper and lower semiconductor chips 220a, 220b, 220c, and 210a may be a volatile memory device such as a DRAM or a SRAM, a nonvolatile memory device such as a flash memory, an optoelectronic device, a logic device, a communication device, or a digital signal processor, a system-on-chip (SOC), or other such device.

The plurality of conductive elements 121, 122, 123, and 124 formed in the second substrate 120a may include power supply wires and ground wires. The ground connection portions 505, 507, and 509 may be formed through the encapsulation material. They may extend in a direction perpendicular to the second substrate 120a. They may electrically connect the shielding can 300d and the ground wires included in the plurality of conductive elements 121, 122, 123, and 124. The ground connection portions 505, 507, and 509 may include TVs. The ground connection portions 505, 507, and 509 may be formed by forming via holes in the encapsulation material, which covers the upper semiconductor chips 220a, 220b, and 220c mounted on the second substrate 120a, and then applying a conductive material into the via holes. The ground connection portions 505 and 509 may electrically connect a soft magnetic material layer 303d formed of a conductive material or a metal layer 301d included in the shielding can 300d and the ground wires included in the plurality of elements 121, 122, 123, and 124 to one another. According to the exemplary embodiment of FIG. 4, the ground connection portion 507 may electrically connect a ground terminal (not shown) of the upper semiconductor chips 220a, 220b, and 220c and the soft magnetic material layer 303d formed of a conductive material or the metal layer 301d included in the shielding can 300d to each another. The ground terminal may be a terminal through which each of the semiconductor chips 220a, 220b, 220c, and 210a is connected to the ground wires and may be a terminal electrically connected to a ground voltage GND.

As described above, since the shielding can 300d including the soft magnetic material surrounds an upper portion and side portions of the semiconductor package 10d, the shielding can 300d may remove EMI radiated in various directions. The shielding can 300d may also simultaneously be connected to the ground voltage GND and may perform an improved operation of removing EMI compared to a conventional method of removing EMI. Also, in the exemplary embodiment of FIG. 4, the semiconductor package 10d includes the shielding can 300d mounted on the upper portion of the semiconductor package 10d after the semiconductor package 10d is manufactured. This configuration simplifies the manufacturing process. Also, the shielding can 300d may be formed to a small size. For example, in one particular exemplary embodiment, the shielding can 300d including the soft magnetic material may have a thickness less than 300 μm.

The plurality of lower conductive elements 111, 112, 113, and 114 formed in the first substrate 110a may be electrically connected to the plurality of upper conductive elements 121, 122, 123, and 124 formed in the second substrate 120a via conductive substrate connection portions 701, 702, 703, and 704. The conductive substrate connection portions 701, 702, 703, and 704 may have different structures according to a method used to mount the lower semiconductor chip 210a on the first substrate 110a. For example, in the exemplary embodiment illustrated in FIG. 4, the lower semiconductor chip 210a may be mounted on the first substrate 110a in a flip chip configuration. When the lower semiconductor chip 210a is mounted on the first substrate 110a in the flip chip configuration, the lower semiconductor chip 210a is bonded to the first substrate 110a in a capillary underfill (CUF) manner. Thus, in the exemplary embodiment of FIG. 4, on the first substrate 110a, a first lower region 410a defined by the second substrate 120a and the shielding can 300d may be a cavity, and the substrate connection portions 701, 702, 703, and 704 may be conductive bumps.

Figure 5:
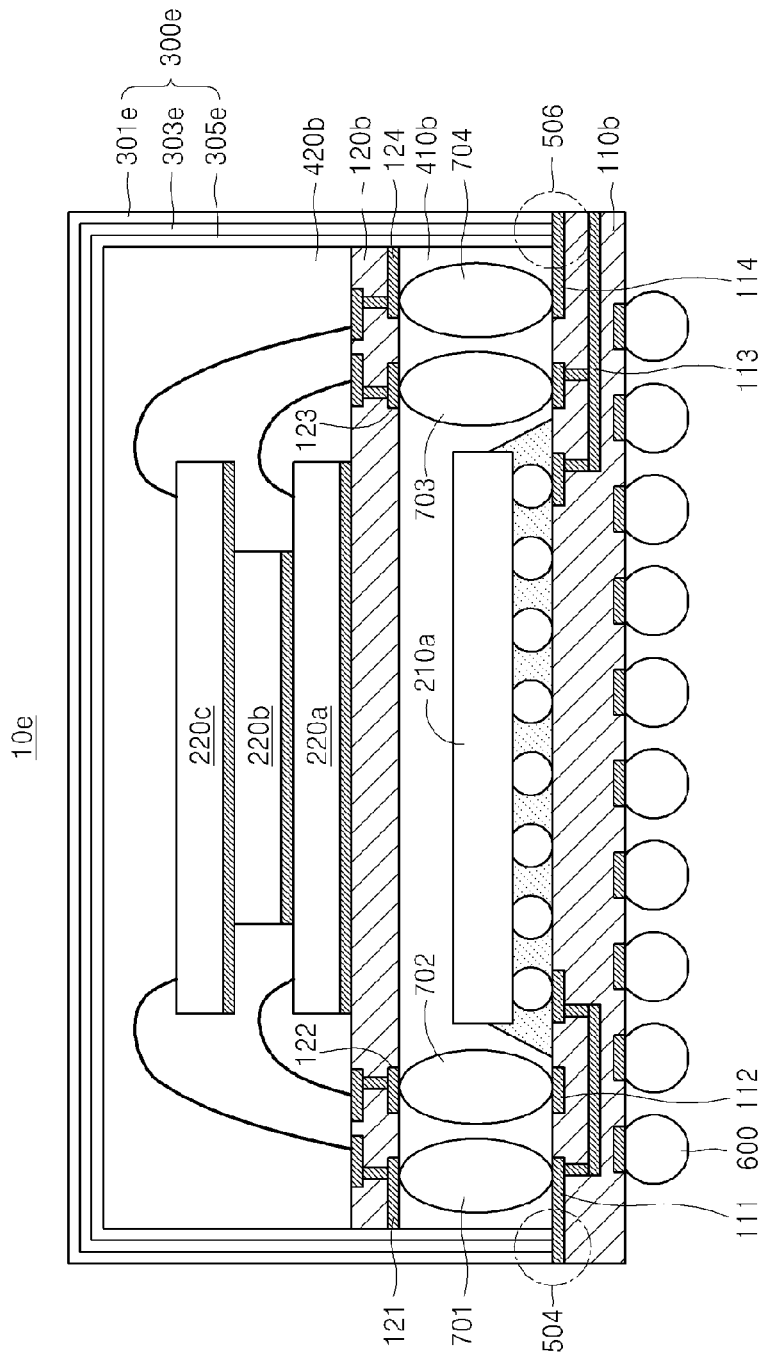

FIG. 5 is a schematic cross-sectional view of a semiconductor package 10e according to another embodiment of the inventive concept. Referring to FIG. 5, the semiconductor package 10e of this exemplary embodiment may include a first substrate 110b, a second substrate 120b, upper semiconductor chips 220a, 220b, and 220c, at least one lower semiconductor chip 210a, a shielding can 300e, and ground connection portions 504 and 506.

Comparing the semiconductor package 10e of FIG. 5 to the semiconductor package 10d of FIG. 4, the shielding can 300e of the semiconductor package 10e of FIG. 5 is electrically connected to ground wires 111 and 114 of a plurality of conductive elements 111, 112, 113, 114, 121, 122, 123, and 124 formed in the substrates 110b and 120b. The remaining elements of the exemplary embodiment of FIG. 5 are substantially the same as those of the exemplary embodiment of FIG. 4, described above in detail in connection with FIG. 4. Therefore, detailed description of those elements will not be repeated here.

According to the exemplary embodiment of FIG. 5, the semiconductor package 10e may further include an encapsulation material that seals a first upper region 420b defined by the shielding can 300e on the second substrate 120b. The encapsulation material may include an epoxy mold compound (EMC).

The first substrate 110b and the second substrate 120b may include the plurality of conductive elements 111, 112, 113, 114, 121, 122, 123, and 124 formed on or in the substrates 110b and 120b. Each of the first substrate 110b and the second substrate 120b may constitute a semiconductor package. The semiconductor package 10e according to the current embodiment may have a POP or PIP structure.

In some exemplary embodiments, the shielding can 300e including a soft magnetic material may be electrically connected to the ground wires 111 and 114 among the plurality of wires 111, 112, 113, 114, 121, 122, 123, and 124 formed in the first substrate 110b. Thus, according to this exemplary embodiment, the ground connection portions 504 and 506, which may connect the shielding can 300e to a ground voltage GND, may be regions where the shielding can 300e and the ground wires 111 and 114 directly contact each other. The ground wires 111 and 114 are exposed on the first substrate 110b and thus the shielding can 300e and the ground wires 111 and 114 may be electrically connected to each other.

When the shielding can 300e is electrically connected to the ground wires 111 and 114 formed in the first substrate 110b, the shielding can 300e may not be connected to the ground voltage GND via the TVs, as in the exemplary embodiment of FIG. 4.

Figure 6:
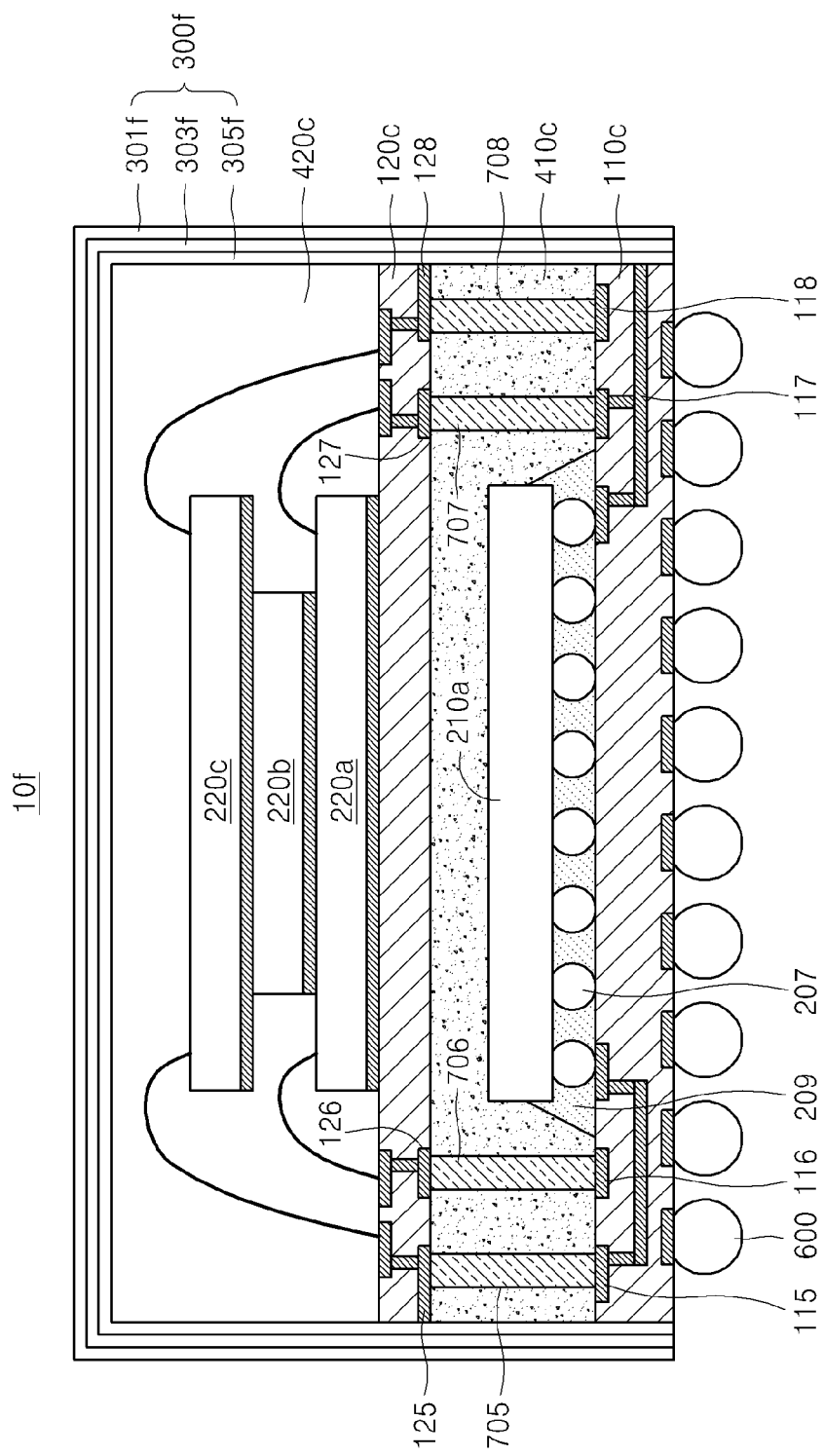

FIG. 6 is a schematic cross-sectional view of a semiconductor package 10f according to another exemplary embodiment of the inventive concept. Referring to FIG. 6, the semiconductor package 10f of this exemplary embodiment may include a first substrate 110c, a second substrate 120c, upper semiconductor chips 220a, 220b, and 220c, at least one lower semiconductor chip 210a, a shielding can 300f, and substrate connection portions 705, 706, 707, and 708.

In FIG. 6, the same reference numerals as those of FIGS. 4 and 5 refer to the same elements of FIGS. 4 and 5, described above in detail in connection with FIGS. 4 and 5. Therefore, detailed description of those elements will not be repeated here.

In this exemplary embodiment, the shielding can 300f may include a soft magnetic material layer 303f including a soft magnetic material. The soft magnetic material in the soft magnetic material layer 303f may not be continuously included. According to the embodiment of FIG. 6, the soft magnetic material may be included in material layers other than the soft magnetic material layer 303f in the shielding can 300f.

In this exemplary embodiment, the shielding can 300f may be electrically connected to ground wires 125 and 128 among a plurality of conductive elements 125, 126, 127, and 128 formed on or in the second substrate 120c. The shielding can 300f may be directly connected to portions of the ground wires 125 and 128 where the ground wires 125 and 128 are exposed to be connected to the second substrate 120c. In addition, the shielding can 300f may not be connected to the first substrate 110c, a ground terminal of the upper semiconductor chips 220a, 220b, and 220c, or a ground terminal of the lower semiconductor chip 210a. Thus, in this exemplary embodiment, ground connection portions may be regions where the shielding can 300f and the ground wires 125 and 128 of the second substrate 120c are electrically connected to one another.

In the exemplary embodiment illustrated in FIG. 6, a second lower space 410c defined by the second substrate 120c and the shielding can 300f on the lower semiconductor chip 210a may be sealed by an encapsulation material when the lower semiconductor chip 210a is mounted on the first substrate 110c. The second lower space 410c may be sealed by the encapsulation material by using a molded underfill (MUF) process by which conductive bumps 207 between the lower semiconductor chip 210a and the first substrate 110c are sealed. In addition, according to this exemplary embodiment, the second lower space 410c may be sealed by the encapsulation material after the lower semiconductor chip 210a is mounted, regardless of the conductive bumps 207. The substrate connection portions 705, 706, 707, and 708 may form TVs by forming via holes in the encapsulation material and by filling a conductive material in the via holes.

Although not shown in the drawing of FIG. 6, the semiconductor package 10f according to the exemplary embodiment of FIG. 6 further includes the ground connection portions. The ground connection portions may be formed such that the shielding can 300f is able to be electrically connected to the ground wires 125 and 128 formed in the second substrate 120c. Alternatively, the shielding can 300f is able to be electrically connected to ground wires 111 and 114 formed in the first substrate 110c, as illustrated in FIGS. 4 and 5.

Figure 7:
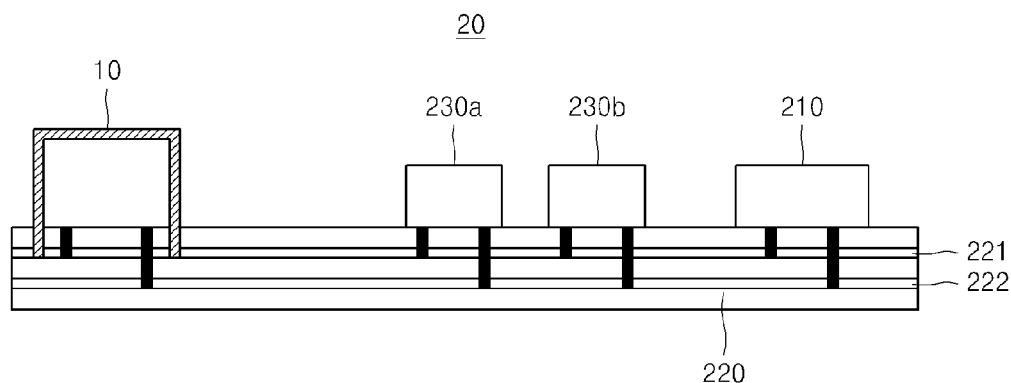

FIG. 7 is a schematic cross-sectional view of a semiconductor package 20 according to another exemplary embodiment of the inventive concept. Referring to FIG. 7, the semiconductor package 20 of this exemplary embodiment may include an integrated circuit (IC) package 10, a voltage generation module 210, and a mother board 220.

According to the embodiments of the inventive concept, the mother board 220 may be a PCB or may be a semiconductor substrate, such as a silicon substrate, a Si—Ge substrate, an SOI substrate or other substrate. The mother board 220 may include a first ground conductive element or ground wire 221 and a first power supply conductive element or power supply wire 222.

The voltage generation module 210 may supply an operating voltage VOP to the first power supply wire 222 of the mother board 220 by sensing a voltage condition required in the semiconductor package 20 by receiving a power supply voltage VDD. The voltage generation module 210 may include a voltage regulating module (VRM). In some exemplary embodiments, the operating voltage VOP may be substantially the same as the power supply voltage VDD of the IC package 10.

The IC package 10 may be electrically connected to the first ground wire 221 and the first power supply wire 222 of the mother board 220. According to the inventive concept, the IC package 10 may have substantially the same structure as any of those of the embodiments of semiconductor packages 10a, 10b, 10c, 10d, and 10e described in detail above with reference to FIGS. 1 through 6. The semiconductor package 20 may also include a plurality of IC packages 10.

In some exemplary embodiments, the IC package 10 may include a first substrate, at least one semiconductor chip, an encapsulation material that covers the at least one semiconductor chip, and a shielding can. The IC package 10 may be electrically connected to the first ground wire 221 and the first power supply wire 222 of the mother board 220 by including a conductive external connection electrode. The shielding can included in the IC package 10 is electrically connected to the first ground wire 221. As illustrated in FIG. 7, the shielding can may be mounted on a portion of the mother board 220 where the first ground wire 221 of the mother board 220 is formed, so that the shielding can may be electrically connected to the first ground wire 221 formed in the mother board 220.

According to some exemplary embodiments, the IC package 10 is electrically connected to the first ground wire 221 and the first power supply wire 222 formed in the mother board 220. Furthermore, the shielding can included in the IC package 10 may be electrically connected to the first ground wire 221 of the mother board 220 or may be electrically connected to a second ground wire formed in the first substrate included in the IC package 10 or a ground terminal included in the at least one semiconductor chip. For example, in some embodiments, the shielding can may be electrically connected to the first substrate via TVs that extend in a direction perpendicular to the first substrate.

According to the exemplary embodiment of FIG. 7, the semiconductor package 20 may further include passive elements 230a and 230b which are used to improve signal integrity that may be degraded when at least one circuit is integrated in the IC package 10 and signals are transmitted. The passive elements 230a and 230b may also be used to improve power integrity, which may be degraded due to power supply interference. For example, in some exemplary embodiments, the passive elements 230a and 230b may include a decoupling capacitor. Signal integrity and power integrity may be improved by including the passive elements 230a and 230b.

The semiconductor packages 10a, 10b, 10c, 10d, 10e, 10f, and 20 illustrated in and described in detail above in connection with FIGS. 1 through 7 may be fabricated not only in a POP structure or by using a BGA, as described above, but also in chip scale packages (CSPs), plastic leaded chip carriers (PLCC), plastic dual in-line packages (PDIP), die in waffle pack, die in wafer form, chip on board (COB), ceramic dual in-line package (CERDIP), plastic metric quad flat pack (MQFP), thin quad flatpack (TQFP), small outline (SOIC), shrink small outline package (SSOP), thin small outline (TSOP), thin quad flatpack (TQFP), system in package (SIP), multi chip package (MCP), wafer-level fabricated package (WFP), wafer-level processed stack package (WSP), or other configuration.

Figure 8:
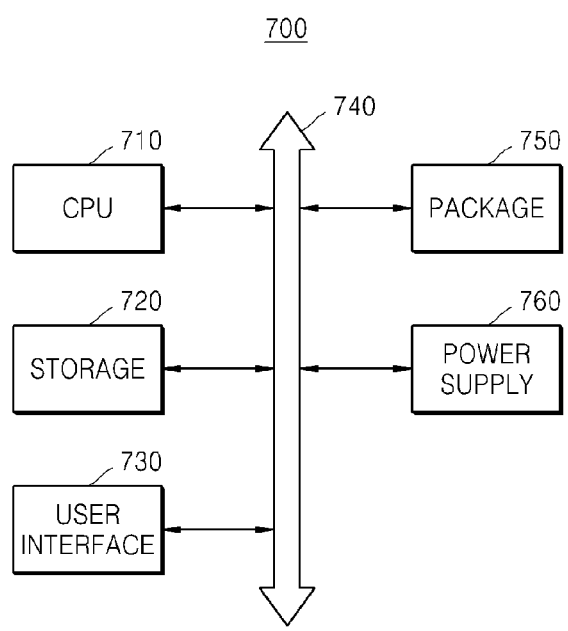
FIG. 8 is a schematic functional block diagram of a memory device including a semiconductor package, according to an embodiment of the inventive concept.

FIG. 8 is a schematic block diagram of a memory device 700 including a semiconductor package 750, according to an exemplary embodiment of the inventive concept. Referring to FIG. 8, the memory device 700 of this exemplary embodiment may include a central processing unit (CPU) 710, a storage unit 720 such as a memory unit, a user interface unit 730, a data bus 740, and a power supply 760.

The CPU 710 controls the operation of the memory device 700 via the data bus 740. The CPU 710 may communicate with an external device and may receive a control signal from the external device, such as a host. For example, the CPU 710 may communicate with the external device via various interface protocols, such as universal serial bus (USB), multimedia card (MMC), peripheral component interconnect express (PCI-E), serial advanced technology attachment (SATA), parallel ATA (PATA), small computer system interface (SCSI), enhanced small disk interface (ESDI), integrated drive electronics (IDE), or other interface protocol.

The storage unit 720 stores data that is input to/output from the CPU 710. The storage unit 720 may be implemented as one or more memory devices, such as, for example, a high-speed SRAM.

The user interface unit 730 performs an interfacing operation, which, in some exemplary embodiments, can include converting a signal into a form that can be readily recognized by a user for convenience of use of the memory device 700, to supply a converted signal to a data output circuit, which can be a monitor or a printer. Alternatively, the user interface unit 730 may convert a user input signal into a signal that is appropriate for the memory device 700.

According to the embodiments of the inventive concept, the semiconductor package 750 is surrounded by a shielding can that includes a soft magnetic material, as described in detail above. According to the exemplary embodiment of FIG. 8, the memory device 700 may be surrounded by the shielding can including the soft magnetic material. The semiconductor package 750 may include a substrate, at least one semiconductor chip mounted on the substrate, and a shielding can, as described in detail above in connection with the various exemplary embodiments of the inventive concept. The structure of the semiconductor package 750 may be substantially the same as any of the structures of FIGS. 1 through 6 described in detail above. Accordingly, detailed description thereof will not be repeated here. The semiconductor package 750 may include at least one of the semiconductor chips described above in detail, and may prevent malfunctions that may occur in the semiconductor package 750 due to EMI generated according to signal and power supply. In addition, according to this exemplary embodiment, the semiconductor package 750 may further include a heat slug that emits heat generated due to the operation of semiconductor chips so as to keep a uniform operating temperature so that operating reliability is improved. Thus, in the semiconductor package 750 of the memory device 700 according to the current embodiment, operating errors that may occur due to integrated circuits may be prevented.

In addition, when the memory device 700 is realized in a from factor or shape compatible with a mobile device, such as a cell phone, a personal digital assistant (PDA), a digital camera, or an MP3 player, the memory device 700 may further include a power supply 760 so as to supply an operating voltage to the memory device 700 and may further include an application chipset, a camera image processor (CIS), a mobile DRAM (MDRAM), or the like according to an application to which the memory device 700 is applied.

While the inventive concept has been particularly shown and described with reference to exemplary embodiments thereof, it will be understood that various changes in form and details may be made therein without departing from the spirit and scope of the inventive concept, as defined by the following claims.

What is claimed is:

1. A semiconductor package, comprising:
a substrate on which a plurality of conductive elements is formed;
at least one semiconductor chip electrically connected to at least one of the plurality of conductive elements; and
a shielding can mounted on the substrate, the shielding can surrounding and spaced apart from the at least one semiconductor chip, the shielding can being electrically connected to at least one conductive element of the plurality of conductive elements, wherein the shielding can is formed of a multi-layer comprising a metal layer, an insulating adhesive layer and a soft magnetic material layer between the metal layer and the insulating adhesive layer, wherein the insulating adhesive layer is between the at least one semiconductor chip and the soft magnetic material layer.

2. The semiconductor package of claim 1, wherein the shielding can comprises an iron oxide and at least one metal, the metal being selected from the group consisting of nickel (Ni), zinc (Zn), manganese (Mn), cobalt (Co), magnesium (Mg), aluminum (Al), barium (Ba), copper (Cu), and iron (Fe).

3. The semiconductor package of claim 1, wherein the plurality of conductive elements comprises ground wires.

4. The semiconductor package of claim 3, further comprising at least one through via (TV) extending in a direction perpendicular to the substrate and electrically connecting the shielding can and the ground wires.

5. The semiconductor package of claim 1, wherein the shielding can is mounted such that it surrounds an upper portion and side portions of the substrate.

6. The semiconductor package of claim 1, further comprising a heat slug formed on the shielding can.

7. The semiconductor package of claim 1, wherein the at least one semiconductor chip comprises a plurality of semiconductor chips, the plurality of semiconductor chips having a vertical stack structure.

8. The semiconductor package of claim 1, wherein a thickness of the shielding can is smaller than 300 μm.

* * * * *